US008138021B2

(12) United States Patent
Corisis et al.

(10) Patent No.: US 8,138,021 B2
(45) Date of Patent: Mar. 20, 2012

(54) APPARATUS FOR PACKAGING SEMICONDUCTOR DEVICES, PACKAGED SEMICONDUCTOR COMPONENTS, METHODS OF MANUFACTURING APPARATUS FOR PACKAGING SEMICONDUCTOR DEVICES, AND METHODS OF MANUFACTURING SEMICONDUCTOR COMPONENTS

(75) Inventors: David J. Corisis, Nampa, ID (US); J. Michael Brooks, Caldwell, ID (US); Choon Kuan Lee, Singapore (SG); Chin Hui Chong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/838,642

(22) Filed: Jul. 19, 2010

(65) Prior Publication Data

US 2010/0279466 A1    Nov. 4, 2010

Related U.S. Application Data

(62) Division of application No. 11/742,297, filed on Apr. 30, 2007, now Pat. No. 7,759,785.

(30) Foreign Application Priority Data

Mar. 12, 2007    (SG) ............................... 200701790-8

(51) Int. Cl.
    *H01L 21/50* (2006.01)
(52) U.S. Cl. ............... 438/108; 438/107; 257/E21.499
(58) Field of Classification Search .................. 257/686, 257/777, E21.499; 438/108, 107
    See application file for complete search history.

(56) References Cited

U.S. PATENT DOCUMENTS

| 5,043,794 | A  | 8/1991  | Tai et al. |
| 5,490,324 | A  | 2/1996  | Newman |
| 5,861,670 | A  | 1/1999  | Akasaki et al. |
| 6,469,374 | B1 | 10/2002 | Imoto |
| 6,472,735 | B2 | 10/2002 | Isaak |
| 6,614,104 | B2 | 9/2003  | Farnworth et al. |

(Continued)

FOREIGN PATENT DOCUMENTS

EP    1489657 A1    12/2004

(Continued)

OTHER PUBLICATIONS

Search Report and Written Opinion issued Jun. 12, 2008 in Singapore Application No. 200701790-8.

(Continued)

*Primary Examiner* — Roy Potter
(74) *Attorney, Agent, or Firm* — Perkins Coie LLP

(57) ABSTRACT

Packaged semiconductor components, apparatus for packaging semiconductor devices, methods of packaging semiconductor devices, and methods of manufacturing apparatus for packaging semiconductor devices. One embodiment of an apparatus for packaging semiconductor devices comprises a first board having a front side, a backside, arrays of die contacts, arrays of first backside terminals electrically coupled to the die contacts, arrays of second backside terminals, and a plurality of individual package areas that have an array of the die contacts, an array of the first backside terminals, and an array of the second backside terminals. The apparatus further includes a second board having a first side laminated to the front side of the first board, a second side, openings through the second board aligned with individual package areas that define die cavities, and arrays of front contacts at the second side electrically coupled to the second backside terminals by interconnects extending through the first board and the second board.

21 Claims, 9 Drawing Sheets

U.S. PATENT DOCUMENTS

| | | |
|---|---|---|
| 6,861,737 B1 | 3/2005 | Jeong et al. |
| 7,132,841 B1 | 11/2006 | Bertin et al. |
| 7,504,283 B2 | 3/2009 | Dunne |
| 7,586,183 B2 * | 9/2009 | Kawabata et al. ............ 257/686 |
| 7,791,206 B2 * | 9/2010 | Takeuchi et al. ............. 257/774 |
| 2001/0023980 A1 | 9/2001 | Ohmori |
| 2003/0049424 A1 | 3/2003 | Yamaguchi et al. |
| 2004/0041260 A1 | 3/2004 | Wood et al. |
| 2004/0175916 A1 | 9/2004 | Shin et al. |
| 2008/0224298 A1 | 9/2008 | Corisis et al. |

FOREIGN PATENT DOCUMENTS

| | | |
|---|---|---|
| EP | 1617714 A1 | 1/2006 |
| JP | 02172295 A | 7/1990 |
| JP | 07022536 A | 1/1995 |
| JP | 07019970 B2 | 3/1995 |
| JP | 2002237682 A | 8/2002 |

OTHER PUBLICATIONS

International Search Report and Written Opinion issued Oct. 17, 2008 in International Application No. PCT/US2008/056424.

Office Action issued Aug. 5, 2010 in People's Republic of China Application No. 200880007696.3, 6 pages.

Office Action issued Sep. 7, 2011 in Taiwan Application No. 097108734, 7 pages.

* cited by examiner

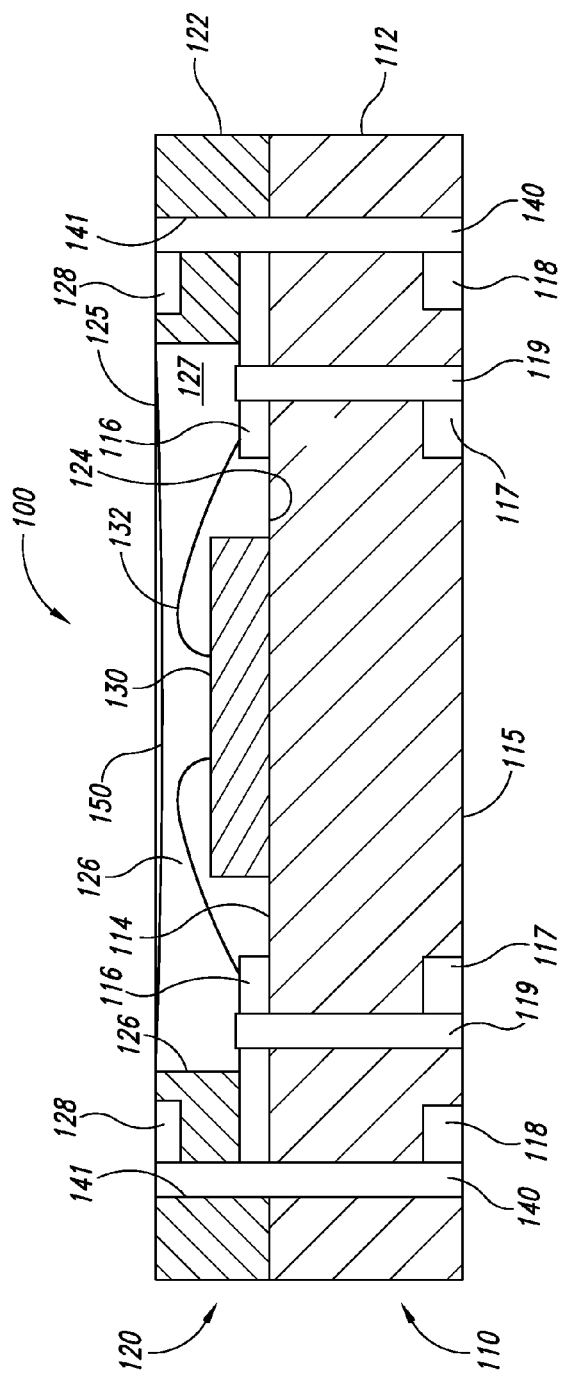
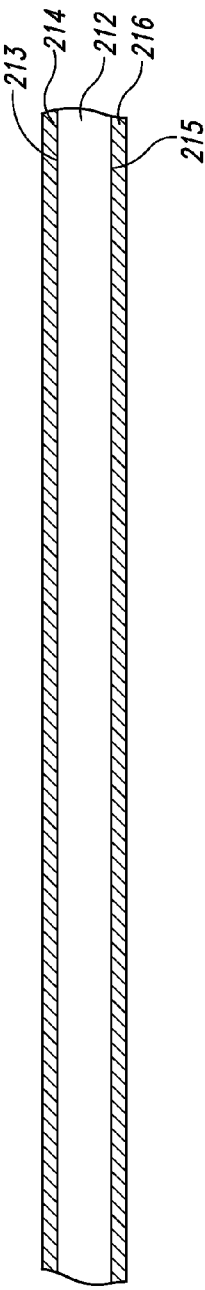
Fig. 1
Fig. 2A

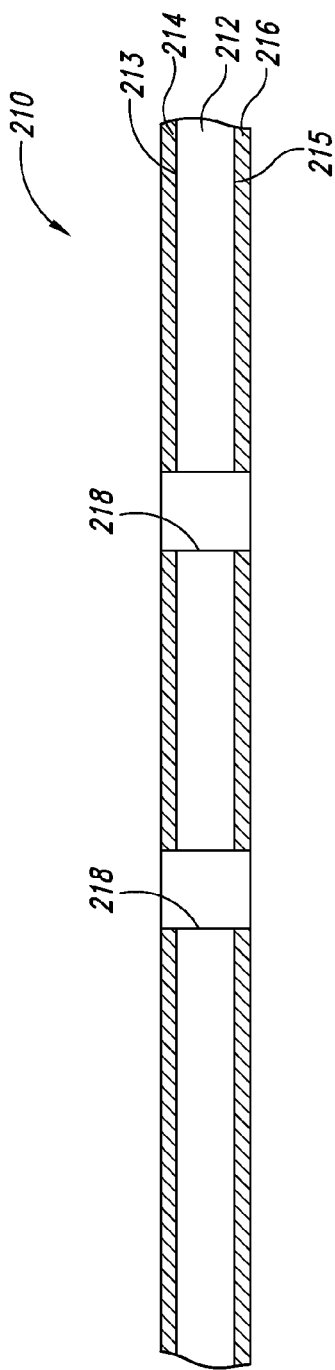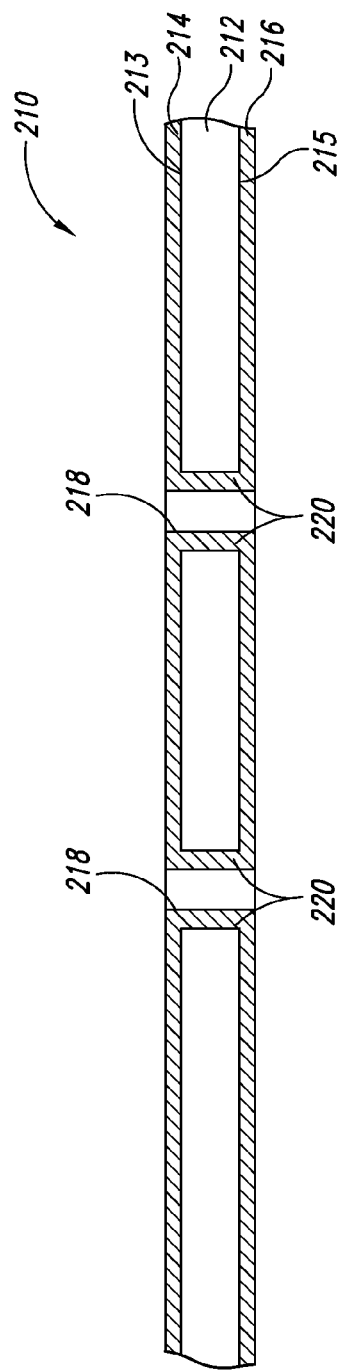

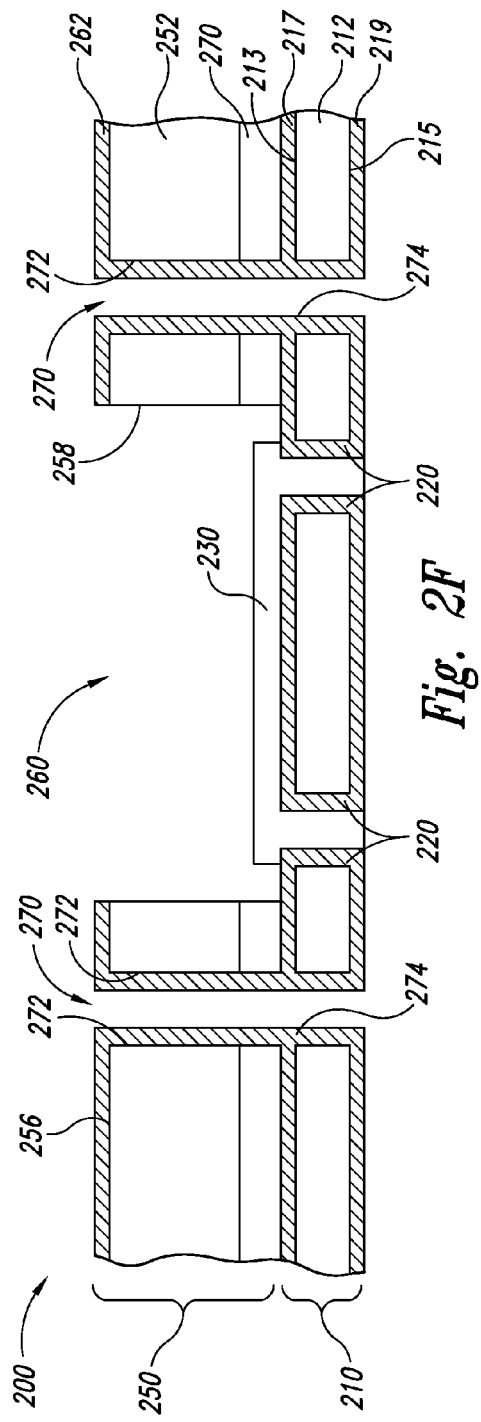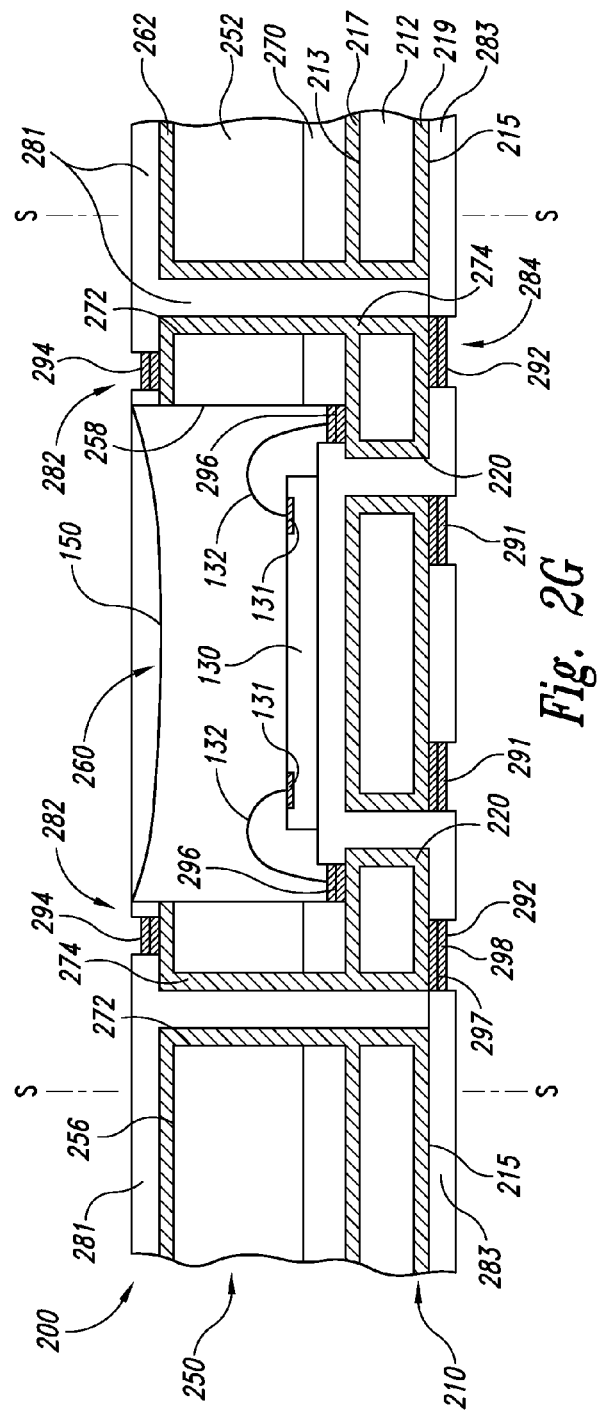

APPARATUS FOR PACKAGING SEMICONDUCTOR DEVICES, PACKAGED SEMICONDUCTOR COMPONENTS, METHODS OF MANUFACTURING APPARATUS FOR PACKAGING SEMICONDUCTOR DEVICES, AND METHODS OF MANUFACTURING SEMICONDUCTOR COMPONENTS

CROSS-REFERENCE TO RELATED APPLICATIONS

This application is a divisional of U.S. application Ser. No. 11/742,297 filed Apr. 30, 2007, now U.S. Pat. No. 7,759,785, which claims foreign priority benefits of Singapore Application No. 200701790-8 filed Mar. 12, 2007, now Singapore Patent No. 146460, both of which are incorporated herein by reference in their entirety.

TECHNICAL FIELD

The present invention is related to packaging semiconductor devices. More specifically, the invention provides apparatus for packaging semiconductor devices, packaged semiconductor components, methods of manufacturing apparatus for packaging semiconductor devices, and methods of manufacturing semiconductor components.

BACKGROUND

Semiconductor devices are typically manufactured on semiconductor wafers or other types of work pieces using sophisticated equipment and processes that enable reliable, high-quality manufacturing. The individual dies (e.g., devices) generally include integrated circuits and a plurality of bond-pads coupled to the integrated circuits. The bond-pads provide an array of external contacts through which supply voltage, electrical signals, and other input/output parameters are transmitted to/from the integrated circuits. The bond-pads are usually very small, and they are typically arranged in dense arrays having fine pitches between bond-pads. The dies are quite delicate and need to be protected from the environment and for handling. As a result, the dies are packaged to protect them and to connect the bond-pads to an array of larger terminals that are easier to connect to a printed circuit board. The packaged semiconductor components can then be electrically connected to other microelectronic devices or circuits in many types of products.

Ceramic packages are one type of packaging for semiconductor dies. Ceramic packages typically have individual ceramic units that have a cavity, die contacts within the cavity, and external terminals electrically coupled to the die contacts. The external terminals are generally on the exterior sidewall or backside of the ceramic unit. A die is positioned in the cavity, and the bond-pads on the dies are electrically coupled to the die contacts within the cavity. An encapsulant is then deposited into the cavity to cover the die.

Ceramic packages are useful in many applications, but they also have several drawbacks. One drawback of ceramic packages is that the ceramic units are generally handled individually instead of being in the form of a wafer that can be handled in wafer processing equipment. As a result, each of the individual ceramic units must be loaded into trays for the packaging process, and then unloaded for subsequent processing. This type of handling is costly and impacts the throughput of packaging processes. Ceramic packages are also relatively expensive to a manufacturer compared to other types of packages. Therefore, ceramic packages have several drawbacks.

Another cavity-type semiconductor package has a polymer riser laminated to a circuit board. For example, Kinsus Company of Korea makes a non-stacking cavity package that includes a printed circuit board having a plurality of die contacts on one side and a plurality of backside contacts on the other side. The package further includes an upper board without circuitry laminated to the printed circuit board. The upper board has openings that define cavities over the printed circuit board, but the upper board does not include any circuitry or vias. A die is mounted to the printed circuit board within the cavity formed by the opening in the upper board, and the bond-pads on the die are connected to the die contacts on the printed circuit board. The cavity is then filled with a polymer or other type of encapsulant to encapsulate the die.

Although such laminated packages are useful and relatively inexpensive to manufacture, they are not well suited for stacking packages in high-density applications. For example, such laminated packages cannot be used in stacked assemblies because these packages do not provide an electrical connection that routes power and signals to/from the upper package(s). Therefore, it would be desirable to develop a cavity-type package using laminated circuit board material for manufacturing high-density stacks with fully tested packages.

BRIEF DESCRIPTION OF THE DRAWINGS

FIG. 1 is a cross-sectional view illustrating a packaged semiconductor component in accordance with an embodiment of the invention.

FIGS. 2A-G are cross-sectional views illustrating stages of a method for manufacturing packaged semiconductor components in accordance with an embodiment of the invention.

DETAILED DESCRIPTION

Figure 2D:
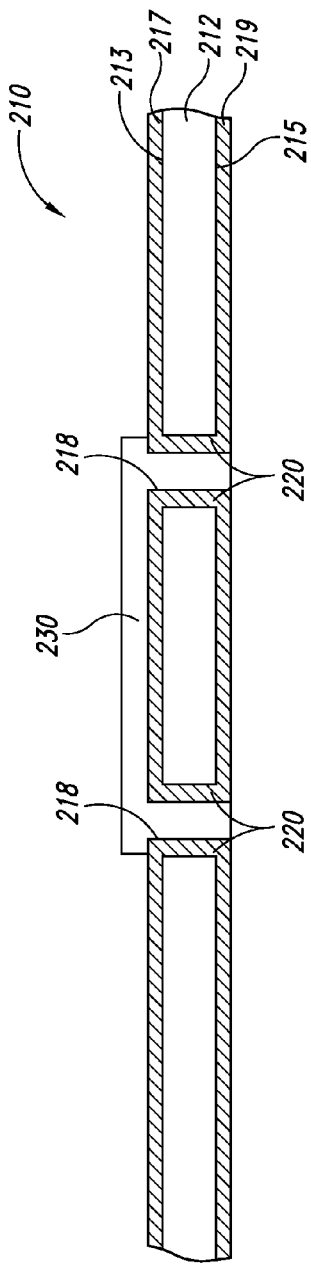

Specific details of several embodiments of the disclosure are described below with reference to packaged semiconductor components, apparatus for packaging semiconductor devices, methods of packaging semiconductor devices, and methods of manufacturing apparatus for packaging semiconductor devices. The devices are manufactured on semiconductor wafers that can include substrates upon which and/or in which microelectronic devices, micromechanical devices, data storage elements, optics, read/write components, and other features are fabricated. For example, SRAM, DRAM (e.g., DDR/SDRAM), flash memory (e.g., NAND/memory), processors, imagers, and other types of devices can be constructed on semiconductor wafers. Although many of the embodiments are described below with respect to semiconductor wafers, other types of devices manufactured on other types of substrates (e.g., dielectric or conductive substrates) may be within the scope of the invention. Moreover, several other embodiments of the invention can have different configurations, components, or procedures than those described below in this section. A person of ordinary skill in the art, therefore, will accordingly understand that other embodiments of the invention may have additional elements, or still more embodiments may not have several of the features and elements shown and described below with reference to FIGS. 1-7.

FIG. 1 is a cross-sectional view that schematically illustrates a packaged semiconductor component 100 in accordance with one embodiment of the invention. In this embodiment, the semiconductor component 100 includes a base 110 having a first substrate 112, a riser 120 having a second substrate 122, and a semiconductor die 130 attached to the base 110. The first and second substrates 112 and 122 can be composed of polymeric materials (resins, silicones, etc.), organic materials other than polymeric materials, or other suitable non-ceramic dielectric materials. For example, the first substrate 112 and the second substrate 122 can be composed of laminated circuit board materials. Several embodiments of the packaged semiconductor component 100 provide a cost-effective cavity-type package composed of a polymeric material that is suitable for stacking. In specific embodiments, for example, a stacked assembly can have identical or other types of packaged semiconductor components 100 attached to the top of the riser 120 to provide high-density stacks of fully tested packaged devices.

In the illustrated embodiment of the base 110, the first substrate 112 has a front side 114 and a backside 115. The illustrated embodiment of the base 110 further includes a plurality of die contacts 116, a first array of first backside terminals 117 at the backside 115, a second array of second backside terminals 118 at the backside 115. The die contacts 116 in the embodiment shown in FIG. 1 are located at, or at least proximate to, the front side 114 of the first substrate 112. The die contacts 116, however, can be located at the backside 115 in other embodiments for board-on-chip configurations as described in more detail below. The base 110 further includes first interconnects 119 electrically coupling the die contacts 116 to corresponding first backside terminals 117. The packaged semiconductor component 100 can also have wire-bonds 132 electrically connecting bond-pads (not shown) on the die 130 to the die contacts 116. The first interconnects 119 and the wire-bonds 132 can accordingly carry the signals and power between the die 130 and the first backside terminals 117.

In the specific embodiment of the riser 120 shown in FIG. 1, the second substrate 122 includes a first side 124 and a second side 125. The first side 124 of the second substrate 122 is attached to the front side 114 of the first substrate 112 by an adhesive (not shown in FIG. 1) at the interface between the first and second substrates 112 and 122. The illustrated embodiment of the riser 120 further includes an opening 126 that defines a die cavity 127 in which the die 130 is positioned. The riser 120 can further include a plurality of front contacts 128 at the second side 125 of the second substrate 122. The front contacts 128 provide electrical terminals for contacting solder balls or other types of electrical connectors on a packaged component that is stacked on top of the packaged semiconductor component 100.

The packaged semiconductor component 100 can further include a plurality of second interconnects 140 that extend through the base 110 and the riser 120. For example, the packaged semiconductor component 100 can have a through package via 141 that extends through the thickness of the first substrate 112 and the thickness of the second substrate 122. The via 141 can then be at least partially filled with a conductive material to form the second interconnects 140 (e.g., through package interconnects). The second interconnects 140 electrically couple the front contacts 128 at the second side 125 of the second substrate 122 to corresponding second backside terminals 118 at the backside 115 of the first substrate 112. The second interconnects 140 provide a package stack route to transmit power and electrical signals to/from another packaged semiconductor component (not shown) stacked on top of the packaged semiconductor component 100 illustrated in FIG. 1. The second interconnects 140 can also carry power and/or electrical signals for the die 130 shown in the packaged semiconductor component 100 of FIG. 1.

The packaged semiconductor component 100 can further include a protective material 150 in the cavity 127 to cover the die 130 and the wire-bonds 132. The protective material 150 can be deposited using a needle-like dispenser, stenciling, molding, or other suitable technique. The protective material 150 is generally a polymer or other suitable material that covers the die 130 and the wire-bonds 132. The upper surface of the protective material 150 is generally co-planar or below the second side 125 of the second substrate 122. The upper surface of the protective material 150, however, can project above the second side 125 so long as the protective material 150 does not interfere with any packages that may be stacked on top of the packaged semiconductor component 100.

FIGS. 2A-2G illustrate stages of a specific embodiment of a method for packaging semiconductor devices. FIG. 2A illustrates a stage of the method at which a first board 210 (e.g., base panel) has a dielectric core 212, a front side 213, a first conductive layer 214 at the front side 213, a backside 215, and a second conductive layer 216 at the backside 215. The dielectric core 212 can be a polymer, non-polymeric organic material, or another suitable non-ceramic dielectric material. The first and second conductive layers 214 and 216 can be copper or other suitably conductive materials. FIG. 2B illustrates the first board 210 at a subsequent stage in which first openings 218 are formed through the first conductive layer 214, the dielectric core 212, and the second conductive layer 216. The first openings 218 can be formed by drilling, etching, laser cutting, water jetting, or other suitable techniques. For example, the openings 218 can be formed using mechanical drills or laser drills known in the art.

FIG. 2C illustrates the first board 210 at a stage of the method in which first interconnects 220 are formed in the first openings 218 to electrically couple the first conductive layer 214 to the second conductive layer 216. The first interconnects 220 can be formed by plating material onto the sidewall of the first openings 218 as known in the art. For example, the first interconnects 220 can comprise copper plated onto the sidewalls of the first openings 218. FIG. 2D illustrates another stage of the method in which the first conductive layer 214 has been patterned and etched to form conductive traces 217 on the front side 213 of the first board 210, and the second layer 216 has been patterned and etched to form conductive traces 219 on the backside 215 of the first board 210. A solder mask 230 or other type of dielectric element can also be formed in the region between the openings 218. As described in more detail below, the solder mask 230 provides a die-attach site at which a die is positioned, and the solder mask can fill the open volume in the first openings 218.

Figure 2E:
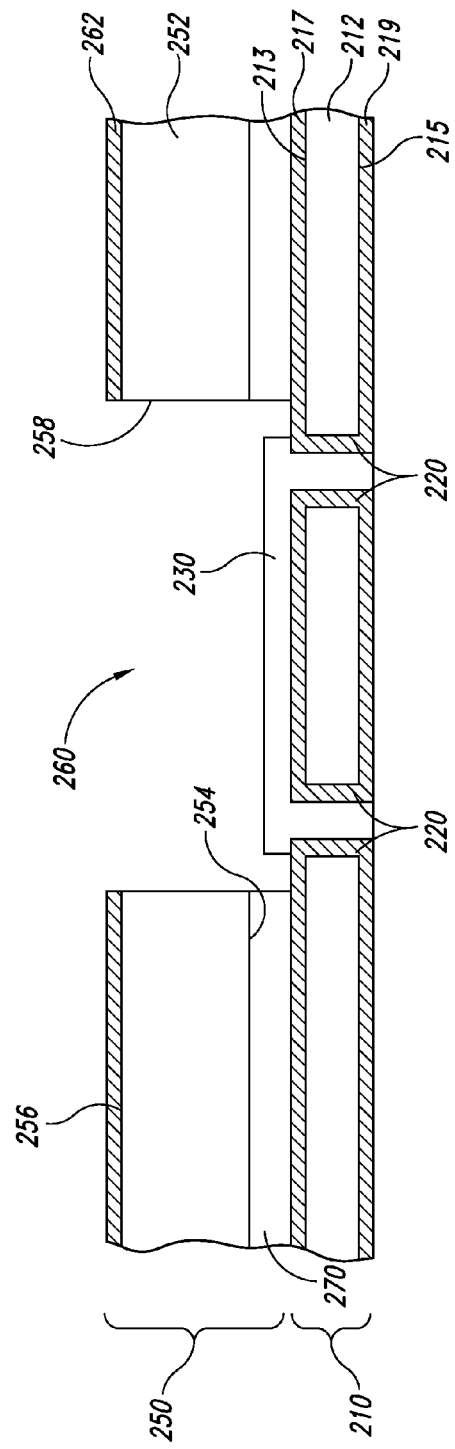

FIG. 2E illustrates a subsequent stage of the method in which a second board 250 is attached to the first board 210. The second board 250 can include a second substrate 252, a first side 254, a second side 256, and an opening 258. The opening 258 can be formed in a previous process by punching larger holes through the second board 250. The opening 258 is aligned with the die-attach site over the solder mask 230 to form a cavity 260 in which a die (not shown in FIG. 2E) can be positioned. The second board 250 can accordingly be a riser panel or riser board that forms the riser projecting above the die. The second board 250 can further include patterned conductive traces 262 on the second side 256.

The second board 250 is attached to the first board 210 by an adhesive 270. In the embodiment illustrated in FIG. 2E, the first side 254 of the second board 250 is attached to the front side 213 of the first board 210 by the adhesive 270. The adhesive 270 can be pre-attached to the first side 254 of the second board 250 or the front side 213 of the first board 210. In many applications, the first board 210 includes a plurality of package regions that each include a die-attach site, and the second board 250 includes a plurality of openings 258. As such, the second board 250 is positioned over the first board 210 such that the openings 258 are aligned with corresponding die-attach sites. Aligning the openings 258 with the die-attach sites may be difficult because the openings 258 will cause the second board to have significantly different contraction/expansion properties than the first board 210. To overcome this, the first and second boards 210 and 250 can have alignment holes through which a jig with alignment pins is connected. The first board 210 and the second board 250 are then moved toward each other along the alignment pins until the adhesive 270 secures the first and second boards 210 and 250 together. The adhesive 270 can have a low flow characteristic such that it does not flow into the cavity 260 and cover the traces 217 at the front side 213 of the first board 210.

FIG. 2F illustrates a portion of an assembled apparatus 200 for packaging semiconductor devices at another stage in which openings 270 (e.g., through package vias) have been formed through the first board 210 and the second board 250. The openings 270 can be drilled through the first and second boards 210 and 250. The openings 270 have sidewalls 272 that extend through the first substrate 212, the adhesive 270, and the second substrate 252. The openings 270 are at least partially filled with a conductive material to form second interconnects 274 (e.g., through package interconnects). The second interconnects 274 can be formed by plating a material, such as copper, to the sidewalls 272 of the openings 270. The second interconnects 274 electrically couple the conductive traces 262 at the second side 256 of the second board 250 to the traces 219 on the backside 215 of the first board 210.

FIG. 2G illustrates the apparatus 200 with a packaged die at a subsequent stage of the method. The apparatus 200 has a first solder mask 281 at the second side 256 of the second board 250. The first solder mask 281 can fill the open space within the openings 270 (FIG. 2F), and the first solder mask 281 has openings 282 over portions of the conductive traces 262 in which front contacts can be formed. In an alternative embodiment, the openings 270 can be filled by a via fill material before applying the first solder mask 281. The apparatus 200 also has a second solder mask 283 at the backside 215 of the first board 210. The second solder mask 283 has openings 284 in which backside terminals can be formed. The apparatus 200 can then be plated to form first backside terminals 291 at the backside 215 of the first board 210, second backside terminals 292 at the backside 215 of the first board 210, and front contacts 294 at the second side 256 of the second board 250. The plating process can also form die contacts 296 at the die-attach site within the cavity 260. The backside terminals and the contacts can be formed by plating a nickel layer 297 onto the traces, and then plating a gold layer 298 onto the nickel layer 297. The first and second backside terminals 291 and 292 can be arranged in conventional JEDEC pinning configurations for bottom or outboard stacking.

After forming the apparatus 200, a die 130 is mounted to the solder mask 230, and bond-pads 131 on the die 130 are connected to the die contacts 296. In the embodiment illustrated in FIG. 2G, the bond-pads 131 are connected to the die contacts 296 by wire-bonds 132. After the die 130 is electrically connected to the apparatus 200, the cavity 260 can be at least partially filled with the protective material 150 as described above with reference to FIG. 1.

Figure 2H:
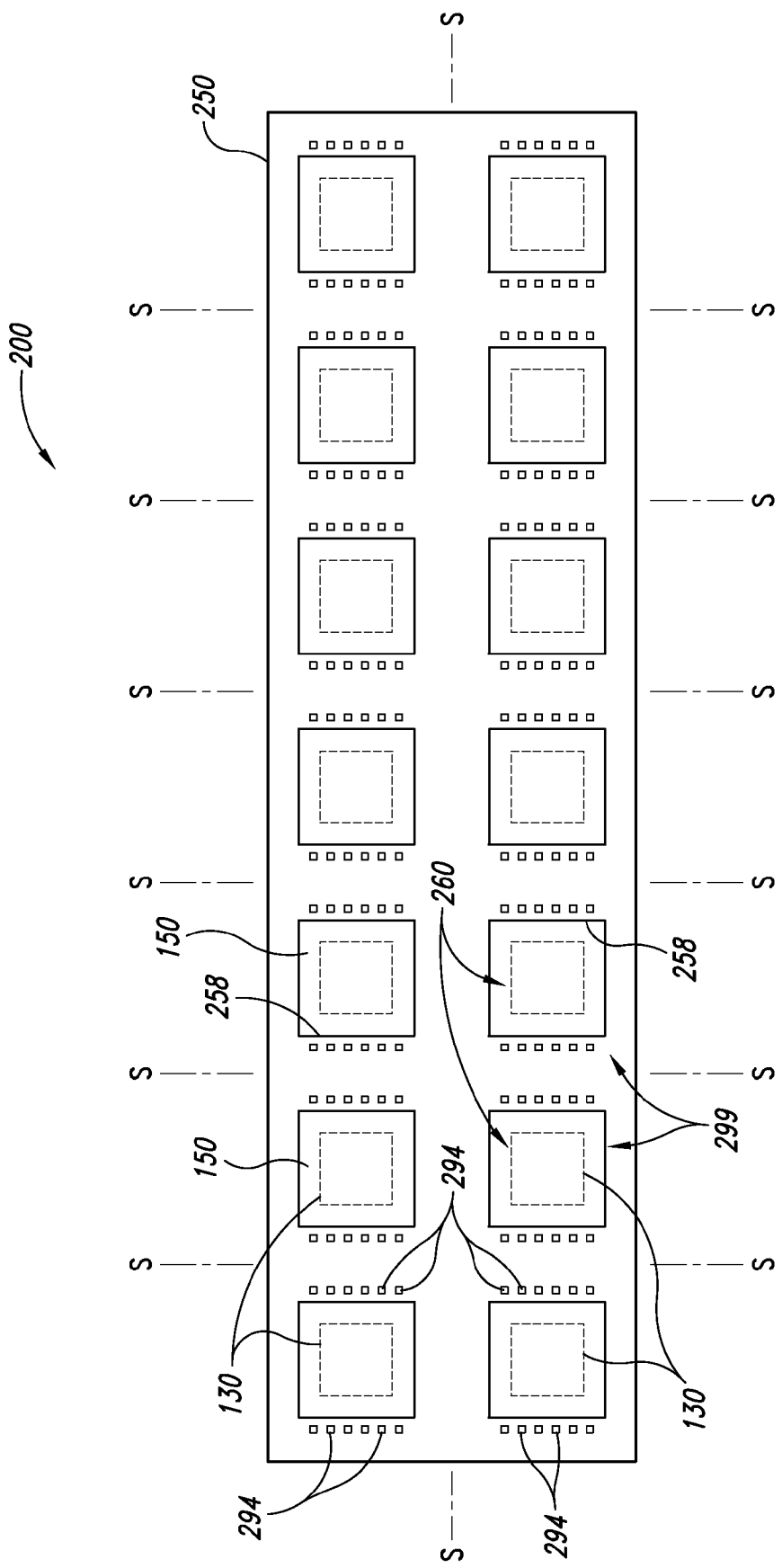
FIG. 2H is a top plan view of a plurality of packaged semiconductor components in accordance with an embodiment of the invention.

FIG. 2H is a top view illustrating the apparatus 200 with a plurality of packaged dies 130. Referring to FIGS. 2G and 2H together, the first board 210 (shown in FIG. 2G) and the second board 250 can be configured into a strip having an array of individual package areas 299 (FIG. 2H). The apparatus 200 is cut along lines S-S to separate individual packaged components from each other. In several embodiments, the individual packaged semiconductor components can be tested while the apparatus 200 is in a contiguous strip before cutting the apparatus 200 to avoid handling individual packages for testing. In an alternative embodiment, the apparatus 200 is cut along lines S-S before testing the individual packaged semiconductor components, and then the individual packaged components are loaded into a tray for testing. In either situation, only known-good-packages can be identified before they are stacked or otherwise mounted to a circuit board.

Many embodiments of the apparatus 200 may be significantly less expensive to implement compared to ceramic cavity-type packages. First, a plurality of dies can be mounted to the apparatus 200 in a strip format to eliminate the need to transfer individual cavity-type units to/from handling trays. This significantly reduces the time and manufacturing costs associated with cavity-type packaging. Many embodiments of the apparatus 200 may also be relatively inexpensive because the package can be made from polymeric materials or other suitable non-ceramic dielectric materials. Many embodiments of the apparatus 200 and the packaged semiconductor component 100 can accordingly provide a cost-effective cavity-type package suitable for stacking.

Several embodiments of the apparatus 200 and the packaged semiconductor component 100 can also have JEDEC contact configurations on the bottom package for testing and stacking the individual packaged semiconductor component 100 using existing equipment. This further enhances the efficiency of several embodiments of the apparatus 200 and the packaged semiconductor component 100 for manufacturing semiconductor devices.

Several embodiments of the apparatus 200 also enable cost-effective testing of the packaged semiconductor components because the packaged dies can be tested while the apparatus 200 is in a strip format. More specifically, the strip can be arranged in the pattern of a test tray to avoid having to transfer individual packages to/from the test trays. As such, the packaged devices can be tested more efficiently.

Figure 3A:
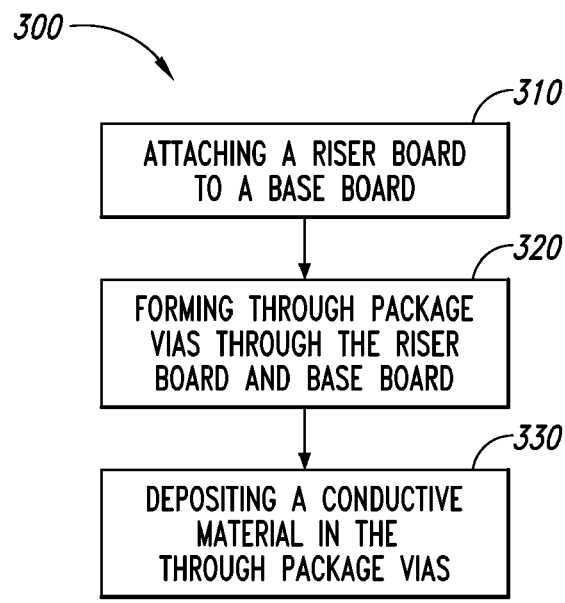
FIGS. 3A and 3B are flow charts illustrating methods in accordance with embodiments of the invention.

FIG. 3A is a flow chart of an embodiment of a method 300 for manufacturing an apparatus for packaging semiconductor devices. The method 300 can include attaching a first side of a riser board to a front side of a base board (block 310). The riser board is attached to the base board so that individual openings in the riser board form die cavities aligned with corresponding individual package areas of the base board.

The base board can have die contacts, first backside terminals at a backside of the base board, and second backside terminals at the backside of the base board. The die contacts can be electrically coupled to the first backside terminals. The method 300 can further include forming a plurality of through package vias extending through the riser board and the base board (block 320). Additionally, the method 300 can further include depositing a conductive material in the through package vias (block 330). The conductive material can form through package interconnects that electrically couple front side contacts at a second side of the riser board to corresponding second backside terminals at the backside of the base board.

Figure 3B:
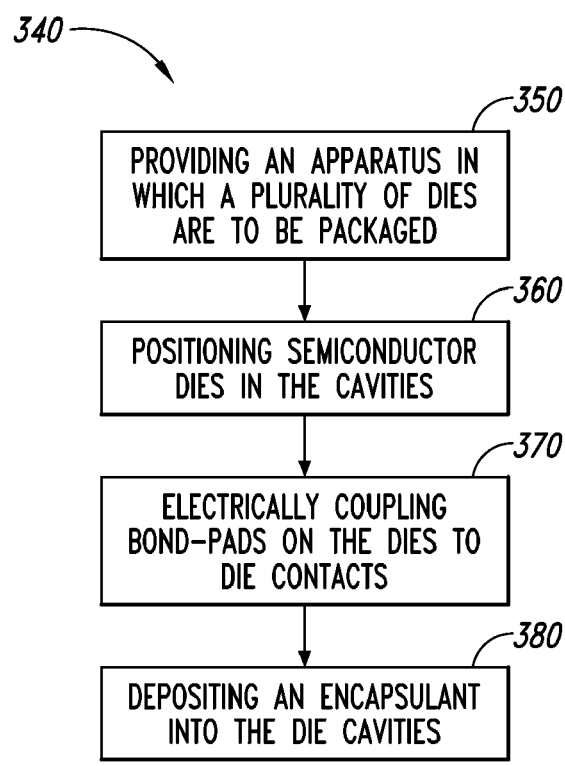

FIG. 3B is a flow chart illustrating an embodiment of a method 340 for manufacturing semiconductor components. In one embodiment, the method 340 can include providing an apparatus in which a plurality of dies are to be packaged (block 350). The apparatus can comprise a first board having a front side, a backside, arrays of die contacts, arrays of first backside terminals electrically coupled to the die contacts, arrays of second backside terminals, and a plurality of individual package areas. The individual package areas can have an array of the die contacts, an array of the first backside terminals, and an array of the second backside terminals. The apparatus can further include a second board having a first side laminated to the front side of the first board, a second side, openings through the second board aligned with individual package areas, and arrays of front contacts at the second side. The openings form die cavities over the first board, and the front contacts are electrically coupled to the second backside terminals by through package interconnects extending through the first board and the second board. The method 340 can further include positioning semiconductor dies in the cavities (block 360), and electrically coupling the dies to corresponding die contacts of the first board (block 370). The method can also include depositing a protective material into the die cavities (block 380) to cover the dies within the cavities. The apparatus with the first and second boards can then be cut to separate individual packaged semiconductor components from each other.

Figure 4:
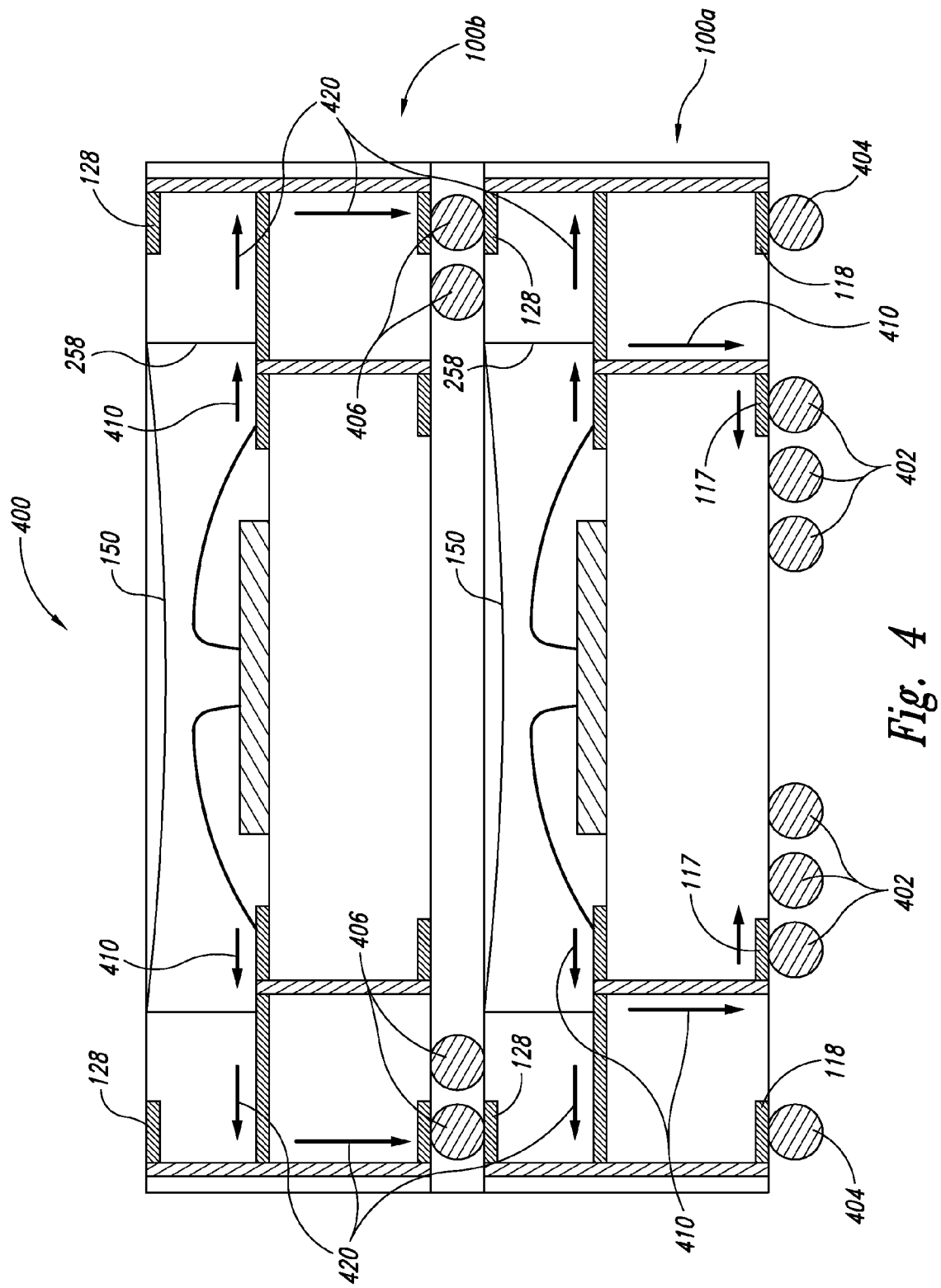
FIG. 4 is a schematic, cross-sectional view illustrating a stacked assembly of packaged semiconductor components in accordance with an embodiment of the invention.

FIG. 4 is a cross-sectional view that schematically illustrates a stacked assembly 400 having a first packaged component 100a and a second packaged component 100b stacked on the first packaged component 100a. The first and second packaged components 100a and 100b can be similar or identical to the packaged semiconductor component 100 described above with reference to FIG. 1. Therefore, like reference numbers can refer to like components in FIGS. 1 and 4. The first packaged component 100a can have a plurality of first connectors 402, such as solder balls, coupled to the first backside terminals 117. The first packaged component 100a can also include additional first connectors 404 coupled to the second backside terminals 118. The connectors 404, however, are optional and may not be included in many embodiments. The second packaged component 100b can include a plurality of second connectors 406, such as solder balls, attached to the second backside terminals 118 on the backside of the second packaged component 100b. The second connectors 406 of the second packaged component 100b are connected to the front contacts 128 of the first packaged component 100a. An underfill or other type of protective material may be inserted between the first and second packaged components 100a and 100b. In operation, the die-to-package routing in the stacked assembly 400 can proceed as shown by arrows 410. Additionally, the routing from the second component 100b to the first packaged component 100a can occur as shown by arrows 420.

Figure 5:
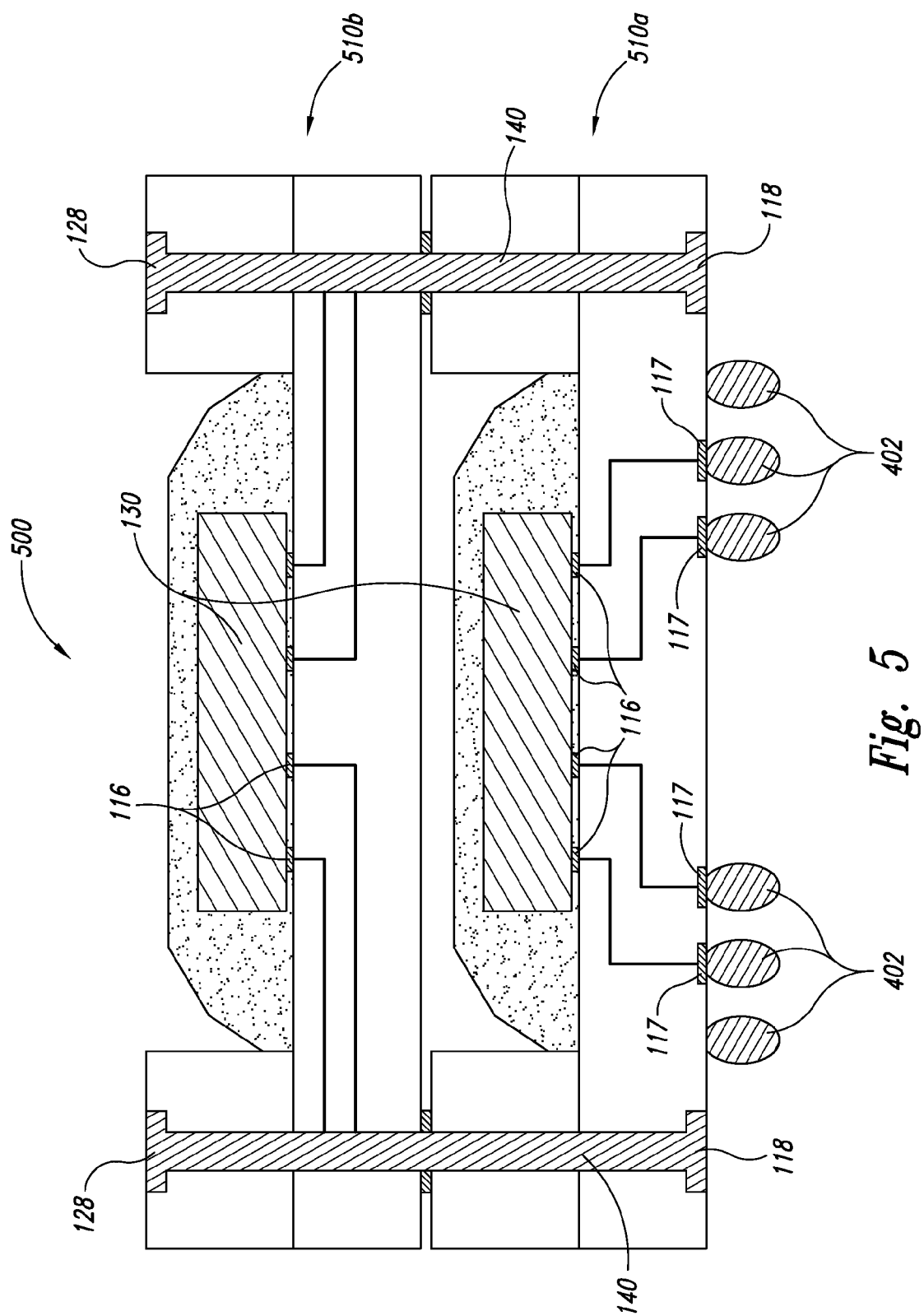
FIG. 5 is a schematic, cross-sectional view illustrating a stacked assembly of packaged semiconductor components in accordance with another embodiment of the invention.

FIG. 5 schematically illustrates a stacked assembly 500 in accordance with another embodiment for flip-chip applications. The stacked assembly 500 includes a first packaged component 510a and a second packaged component 510b. The first and second packaged semiconductor components 510a and 510b can be similar to the packaged semiconductor components 100 described above. However, the dies 130 are flip-chip dies that are connected to the die contacts using flip-chip connections instead of wire-bonds. As such, the die contacts 116 are positioned at the die-attach site to be covered by the die 130.

Figure 6:
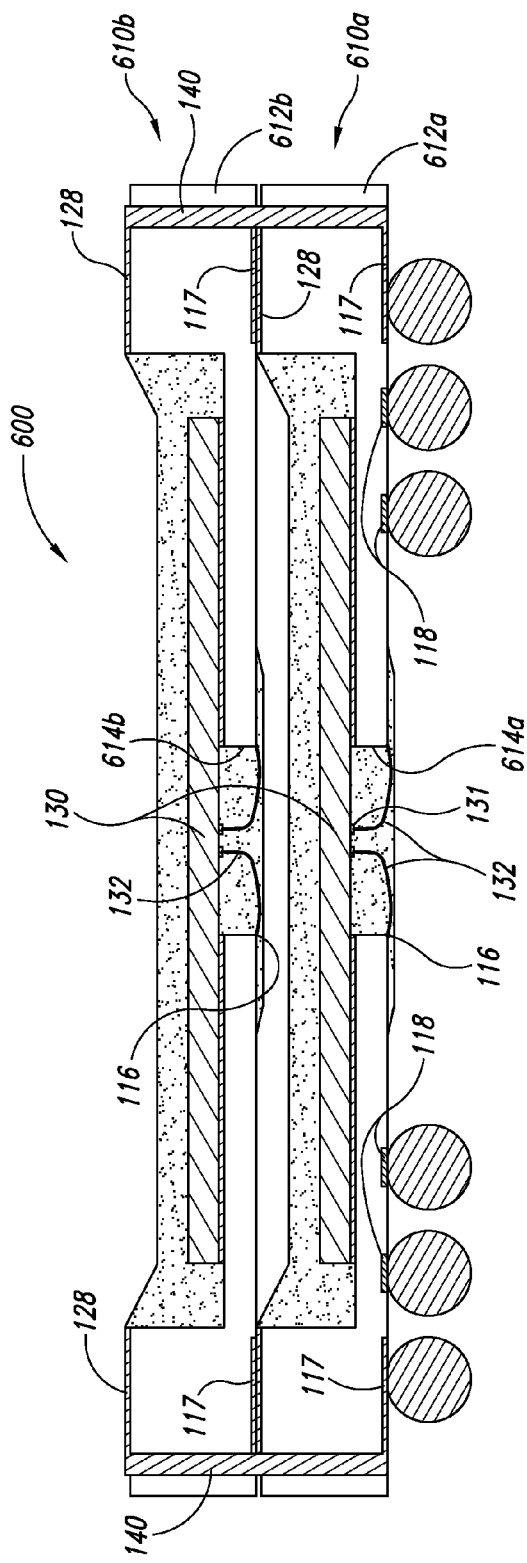
FIG. 6 is a schematic cross-sectional view illustrating a stacked assembly of packaged semiconductor components in accordance with still another embodiment of the invention.

FIG. 6 schematically illustrates a stacked assembly in accordance with still another embodiment for board-on-chip applications. In this embodiment, the stacked assembly 600 includes a first packaged component 610a having a board-on-chip design and a second packaged component 610b also having a board-on-chip design. More specifically, the dies 130 are inverted compared to the dies 130 illustrated in FIG. 1 such that the bond-pads 131 on the dies are wire-bonded to the die contacts 116 on the backside of base boards 612a and 612b of each of the first and second packaged components 610a and 610b, respectively. Referring to the first packaged semiconductor component 610a, the base board 612a has an opening 614a or slot through which the wire-bonds 132 extend from the bond-pads 131 to the die contacts 116. Similarly, the base board 612b can have a slot 614b. The first interconnects from the die contacts 116 can accordingly be traces that extend along the backside of the base board 612a instead of through the base board as shown in the packaged semiconductor component 100 of FIG. 1. The board-on-chip packaged components may accordingly eliminate the metallization of the front side of the base board.

Figure 7:
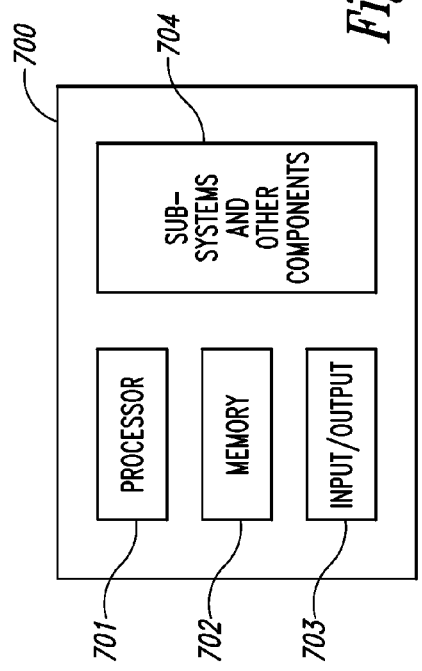
FIG. 7 is a schematic view of a system that incorporates packaged semiconductor components in accordance with embodiments of the invention.

FIG. 7 illustrates a system 700 that includes any one of the packaged semiconductor components described above with reference to FIGS. 1-6. More specifically, any one of the semiconductor components described above with reference to FIGS. 1-6 can be incorporated into any of a myriad of larger and/or more complex systems, and the system 700 is merely a representative sample of such a system. The system 700 can include a processor 701, a memory 702 (e.g., SRAM, DRAM, flash, or other memory devices), input/output devices 703, and/or subsystems and other components 704. The packaged semiconductor components may be included in any of the components shown in FIG. 7. The resulting system 700 can perform any of a wide variety of computing, processing, storage, sensing, imaging, and/or other functions. Accordingly, the system 700 can be, without limitation, a computer and/or other data processor, for example, a desktop computer, laptop computer, Internet appliance, hand-held device, multiprocessor system, processor-based or programmable consumer electronic, network computer, and/or mini-computer. Suitable hand-held devices for these systems can include palm-type computers, wearable computers, cellular or mobile phones, personal digital assistants, etc. The system 700 can further be a camera, light or other radiation sensor, server and associated server subsystems, and/or any display device. In such systems, individual dies can include imager arrays, such as CMOS imagers. Components of the system 700 may be housed in a single unit or distributed over multiple, interconnected units (e.g., through a communications network). The components of the system 700 can accordingly include local and/or remote memory storage devices and any of a wide variety of computer-readable media.

From the foregoing, it will be appreciated that specific embodiments of the invention have been described herein for purposes of illustration, but that various modifications may be made without deviating from the spirit and scope of the invention. For example, specific elements of any of the foregoing embodiments can be combined or substituted for elements in other embodiments. Additionally, where the context permits, singular or plural terms may also include plural or singular terms, respectively. Moreover, unless the word "or" is expressly limited to mean only a single item exclusive from the other items in reference to a list of two or more items, then the use of "or" in such a list means including (a) any single item in the list, (b) all of the items in the list, or (c) any combination of the items in the list. Additionally, the term "comprising" is used throughout the following disclosure to mean including at least the recited feature(s) such that any greater number of the same feature and/or additional types of features or components is not precluded. Accordingly, the invention is not limited except as by the appended claims.

We claim:

1. A method of packaging semiconductor devices, comprising:
    attaching a first side of a riser board to a front side of a base board, wherein die cavities are formed by individual openings in the riser board that are aligned with corresponding individual package areas of the base board, and wherein the base board has die contacts and first backside terminals on a backside of the base board electrically coupled to the die contacts;
    forming a plurality of through package vias extending through the riser board and the base board after attaching the first side of the riser board to the front side of the base board; and
    depositing a conductive material in the through package vias, wherein the conductive material forms through package interconnects that electrically couple front side contacts at a second side of the riser board to corresponding second backside terminals on a backside of the base board.

2. The method of claim 1 wherein before attaching the riser board to the base board, the method further comprises attaching an adhesive to the first side of the riser board and punching the openings through the riser board and the adhesive.

3. The method of claim 1 wherein the base board comprises a first printed circuit board and the riser board comprises a second printed circuit board, and wherein the method further comprises aligning the front side contacts of the riser board with the second backside terminals of the base board and pressing the first side of the riser board and the front side of the base board against an adhesive.

4. The method of claim 3 wherein forming the through package vias comprises drilling holes through the riser board and the base board.

5. The method of claim 1 wherein:
    the method further comprises aligning the front side contacts of the riser board with the second backside terminals of the base board and pressing the first side of the riser board and the front side of the base board against an adhesive; and
    forming the through package vias comprises drilling holes through corresponding pairs of front side contacts and second backside terminals.

6. The method of claim 1 wherein:
    the method further comprises aligning the front side contacts of the riser board with the second backside terminals of the base board and pressing the first side of the riser board and the front side of the base board against an adhesive;
    forming the through package vias comprises drilling holes through corresponding pairs of front side contacts and second backside terminals; and
    depositing a conductive material in the through package vias comprises plating a metal into the holes.

7. The method of claim 1 wherein:
    before attaching the riser board to the base board, the method further comprises forming circuitry on the second side of the riser board, attaching an adhesive to the first side of the riser board, and punching the opening through the riser board and the adhesive; and
    attaching the riser board to the base board comprises pressing the adhesive at the first side of the riser board against the front side of the base board while the openings are aligned with corresponding individual package areas.

8. The method of claim 7 wherein the front side contacts at the second side are superimposed relative to corresponding second backside terminals of the base board, and forming the vias comprises drilling holes at the front side contacts that extend to corresponding backside contacts.

9. The method of claim 8 wherein depositing the conductive material in the vias comprises plating a metal into the holes.

10. A method of manufacturing semiconductor components, comprising:
    providing an apparatus in which a plurality of dies are to be packaged, the apparatus comprising—
        a first board having a front side, a backside, arrays of die contacts, arrays of first backside terminals electrically coupled to the die contacts, arrays of second backside terminals, and a plurality of individual package areas that have an array of the die contacts, an array of the first backside terminals, and an array of the second backside terminals, and
        a second board having a first side laminated to the front side of the first board, a second side, openings through the second board aligned with individual package areas that define die cavities, and arrays of front contacts at the second side electrically coupled to the second backside terminals by through package interconnects extending through the first board and the second board, wherein the through package interconnects are formed after attaching the front side of the first board to the first side of the second board;
    positioning semiconductor dies in the die cavities;
    electrically coupling bond-pads on the dies to corresponding die contacts of the first board; and
    depositing protective material into the die cavities.

11. The method of claim 10 wherein electrically coupling the bond-pads on the dies to the die contacts comprises wire-bonding the bond-pads to the die contacts.

12. The method of claim 10 wherein electrically coupling the bond-pads on the dies to the die contacts comprises flip-chip mounting the bond-pads onto the die contacts.

13. The method of claim 10 wherein:
    the first board has slots and the die contacts are arranged in arrays at the backside of the first board proximate to the slots;
    the dies have an active side attached to the front surface of the first board such that bond-pads on the dies are aligned with a corresponding slot; and
    electrically coupling the bond-pads on the dies to the die contacts comprises forming wire-bonds that extend through the slots from the bond-pads to the die contacts.

14. The method of claim 10, further comprising cutting the first and second boards between the individual package areas, wherein individual packaged semiconductor components are separated from each other.

15. The method of claim 14, further comprising testing the individual packaged semiconductor components and stacking only known-good-packaged semiconductor components on each other.

16. The method of claim 15 wherein stacking comprises electrically coupling front side contacts of a first packaged semiconductor component with corresponding second backside terminals of a second packaged semiconductor component stacked on the first packaged semiconductor component.

17. The method of claim 10, further comprising testing the individual packaged semiconductor components before cutting the first board and the second board to determine known-good-packages.

18. The method of claim 17, further comprising cutting the first and second boards between the individual package areas and stacking only known-good-packaged semiconductor components on each other.

19. The method of claim 18 wherein stacking comprises electrically coupling front side contacts of a first packaged semiconductor component with corresponding second backside terminals of a second packaged semiconductor component stacked on the first packaged semiconductor component.

20. The method of claim 16 further comprising coupling the second side of the second board of the first packaged semiconductor component with the backside of the first board of the second packaged semiconductor component stacked on the first packaged semiconductor component via solder balls between the first and second packaged semiconductor components.

21. The method of claim 10 further comprising at least partially encapsulating the semiconductor dies in a protective material.

* * * * *